US006801162B1

(12) United States Patent
Eckenroth et al.

(10) Patent No.: US 6,801,162 B1
(45) Date of Patent: Oct. 5, 2004

(54) DOPPLER-BASED AUTOMATED DIRECTION FINDING SYSTEM AND METHOD FOR LOCATING CABLE TELEVISION SIGNAL LEAKS

(75) Inventors: Kenneth J. Eckenroth, Rowlett, TX (US); Michael E. Ostteen, Rowlett, TX (US)

(73) Assignee: Cable Leakage Technologies, Inc., Richardson, TX (US)

( * ) Notice: Subject to any disclaimer, the term of this patent is extended or adjusted under 35 U.S.C. 154(b) by 0 days.

(21) Appl. No.: 10/414,771

(22) Filed: Apr. 16, 2003

(51) Int. Cl.$^7$ .............................. G01S 5/02; G01S 3/52
(52) U.S. Cl. ...................... 342/418; 342/417; 342/450
(58) Field of Search ............................ 342/417, 418, 342/450

(56) References Cited

U.S. PATENT DOCUMENTS

| | | | |
|---|---|---|---|
| 4,072,899 | A | 2/1978 | Shimp |
| 5,294,937 | A | 3/1994 | Ostteen et al. |
| 5,608,428 | A | 3/1997 | Bush |
| 5,777,662 | A | 7/1998 | Zimmerman |
| 6,005,518 | A | 12/1999 | Kallina |
| 6,337,711 | B1 | 1/2002 | Dickinson et al. |
| 6,437,740 | B1 * | 8/2002 | De Champlain et al. ... 342/417 |
| 2003/0022645 | A1 | 1/2003 | Runzo |

OTHER PUBLICATIONS

Sunrise Telecom News Release , "Sunrise Telecom to Acquire the CaLan Cable TV Test Business From Agilent Technologies", Jan. 24, 2002.

CaLan 2010B SLM Plus Cable TV Analyzer—Product Description.
CaLan 3010/2010 Signal/Sweep Measurement System, Aug. 2002.
CaLan N1776A Network Profiler—Product Description.
GeoSniffer System User's Guide.
DDF6100D Radio Direction Finder User Manual (missing p. 32).
"Locating Cable TV Leaks Using Doppler Radio Direction Finding Systems", Mar. 15, 1994.
Series 5900 Radio Direction Fnders—Product Description.
Series 6000 Radio Direction Finders—Product Description.
Series 6100 Radio Direction Finders—Product Description.

* cited by examiner

*Primary Examiner*—Theodore M. Blum
(74) *Attorney, Agent, or Firm*—Haynes and Boone, LLP (57) ABSTRACT

Provided is a Doppler based automated direction finding system that detects radio frequency (RF) leaks in a cable television plant. During a ride-out, the system detects leaks and stores leak data, such as amplitude, location, and bearing. The stored data is uploaded to a computer that performs a leak analysis. The leak analysis isolates the leaks using Doppler-based bearing information and separates cable leaks from other RF sources, such as power sources and noise. Erroneous information that results from RF reflections (multi path) may be eliminated while processing the data using triangulation. After the leak analysis, the computer generates work orders and maps, makes the data available to users, and may also compile information and file reports based on the data.

20 Claims, 7 Drawing Sheets

| Workorder: 6062 | |
|---|---|
| Latitude: | 32.730213 |
| Longitude: | −96.688431 |
| RF: | 68.00 |
| Address: | 111 Anywhere Dr. |
| Detect Time: | 09:00:00 |
| Detect Date: | 2003-03-28 |
| Repair Time: | 00:00:00 |
| Repair Date: | 0000-00-00 |
| Tech: | Not Specified ▼ |
| Cause: | Not Assigned ▼ |
| Category: | Cable Leak ▼ |
| | Update... |

DOPPLER-BASED AUTOMATED DIRECTION FINDING SYSTEM AND METHOD FOR LOCATING CABLE TELEVISION SIGNAL LEAKS

BACKGROUND

The present disclosure relates generally to detecting cable leakage and, more specifically, to a system and method for locating and identifying cable television signal leaks.

Cable television is a system (e.g., a cable "plant") for delivering television signals to subscribers or viewers by means of coaxial cable. When signals above a certain power level leak from the cable plant into the atmosphere, they may conflict with those used by the aviation industry. Signal leakage can occur in a variety of situations, such as when the shielding of cable cracks or becomes weathered, when connectors become loose, or when the cable breaks.

Rules promulgated by the Federal Communications Commission (FCC) require cable television operators to monitor their cable plants, including their transport media (e.g., cables). Among other items, these rules cover monitoring and reporting on signal "leaks" that occur in the cables. To comply with these standards, cable companies must make power measurements of their facilities and report data obtained during the measurements to the FCC.

Although various methods have been developed to locate cable television leaks, each method presents one or more disadvantages. For example, some methods lack effectiveness in locating or identifying leaks, while others are costly or time consuming.

Accordingly, what is needed is a system and method for accurately locating and identifying leaks, recording information regarding each located leak, and utilizing the recorded information to comply with regulatory requirements, schedule repairs, and monitor cable infrastructure.

SUMMARY

Provided is a system and method for detecting cable leakage. In one embodiment, the system is for processing data associated with a plurality of radio frequency (RF) leaks in a cable television system. The data includes a plurality of sets, each set containing signal information, an amplitude, a longitude, a latitude, and Doppler-based bearing information. The system comprises a processor, a memory, and a plurality of instructions. The memory is accessible to the processor and is operable to store the plurality of data sets. The plurality of instructions are for performing a spectral analysis using the signal information to identify whether an RF emission is a leak from the cable television system, performing a Doppler analysis using the longitude, latitude, and bearing information to calculate a location of each leak, and automatically generating repair information using the location calculated by the Doppler analysis.

DETAILED DESCRIPTION

The present disclosure relates generally to detecting cable leakage and, more specifically, to a system and method for locating and identifying cable television signal leaks. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
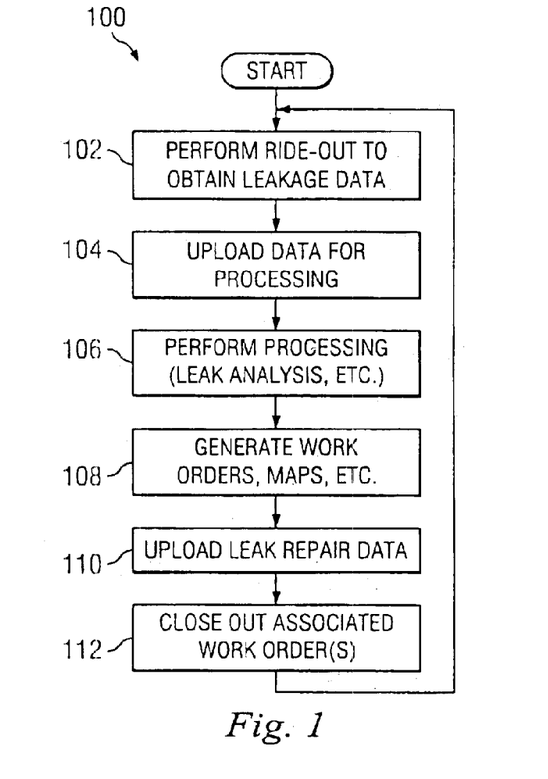
FIG. 1 is a flow chart of an exemplary method for collecting, processing, and provisioning cable leakage data to an end user.

Referring to FIG. 1, in one embodiment, a method 100 illustrates the collection, processing, and provisioning of data that is obtained using a cable leakage detection system. As will be described later in greater detail, the method 100 begins in step 102, where a ride-out is performed. During the ride-out, a vehicle containing the cable leakage detection system traverses a route. The cable leakage detection system automatically stores information about leaks that are detected along the route, such as radio frequency (RF) intensity (e.g., amplitude), location, etc. In step 104, the data is uploaded to a computer for processing.

In step 106, the computer performs data processing operations, which may include performing a leak analysis and/or using Doppler-based calculations to isolate a leak's location. In step 108, work orders may be generated based on the processed data and made available to a user through email, a web page, etc. In addition, street maps may be generated based on the processed data to indicate the locations of leaks. The map generation may include automatically sizing and labeling the maps, and making the maps available to the user. In steps 110 and 112, leak repair data may be uploaded and the work orders associated with the uploaded data may be closed.

It is understood that the method 100 is only one example and that many of the steps may be completed in a different order, and steps may be added or omitted. For example, the method 100 may generate reports using the data and electronically filing the reports with the Federal Communications Commission (FCC).

Figure 2:
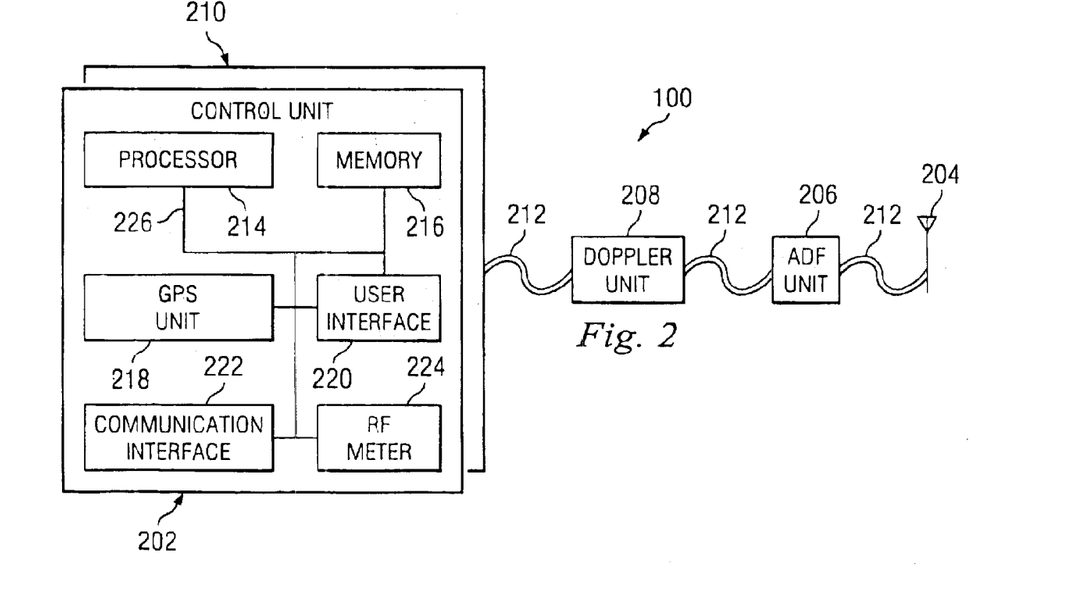
FIG. 2 is a block diagram illustrating components of an exemplary Doppler-based leak detection system that may be used in the method of FIG. 1.

Referring to FIG. 2, one embodiment of a detection system 200, such as may be used in step 102 of FIG. 1, is illustrated. The detection system 200 includes a control unit 202, an antenna unit 204, an automated direction finding (ADF) unit 206, and a Doppler unit 208. The control unit 202, antenna unit 204, ADF unit 206, and Doppler unit 208 may be mounted in a vehicle (not shown). For example, the control unit 202 may be mounted in a docking station 210 in the passenger compartment of the vehicle, with the Doppler unit 208 mounted to the back of the docking station 210. The antenna unit 204 may be secured to the roof of the vehicle, and the ADF unit 206 may be fastened to the antenna unit 204. In the present example, the various components 202, 204, 206, 208 are connected by cables 212, but it is understood that wireless, optical, or other connection means may also be used.

The control unit 202 includes a processor/microcontroller 214, a memory 216, a global positioning system (GPS) unit 218, a user interface 220, a communications interface 222, and an RF meter 224. A bus system 226 may be used to connect the various components 214, 216, 218, 220, 222, 224. The processor 214 is connected to the memory 216, GPS unit 218 (which may be associated with an antenna), user interface 220, communications interface 222, RF meter 224, and Doppler unit 208 (through the docking station 210). The processor 214 receives bearing information from the Doppler unit 208, position information from the GPS unit 218, user input information from the user interface 220, and RF intensity information from the RF meter 224. The processor 214 also stores data in the memory 216. The memory 216 may include permanent memory, removable media (e.g., floppy disks, CD-ROMs, flash cards, etc.), and dynamic memory (e.g., random access memory (RAM)). The communications interface 222 may provide a communications channel between the control unit 202 and the docking station 210. The communications interface 222 may also include components for use in wired or wireless communications with other devices (not shown). Although not shown in detail, the user interface 220 may include buttons, switches, a keypad, a touch screen, or similar interactive controls that let a user interact with the control unit 102, as well as a screen display or other output portion.

The RF meter 224 may be configured to measure signals in a broad spectrum of bandwidths, and may also be configured to display the measured signal strength in a variety of formats. For example, cable television operators generally monitor carrier signals in the frequency bands 108–150 MHz. The RF meter 224 may be configured to monitor the signal strength of carrier signals in these frequency bands. In addition, the RF meter 224 may be configured to calculate signal strength measurements based on the distance between the RF meter 224 and the source of the measured signal. The RF meter 224 or the processor 214 may make adjustments to detected leak levels based on a user defined multiplier that is entered into the control unit 202 through the user interface 220. For example, the control unit 202 may enable the user to indicate a distance from the RF meter 224 to a cable. The distance may be entered or may be selected from a range of distances. The multiplier accounts for the distance, so that selecting a distance of 20 feet results in a multiplier of 2 (e.g., 2×detected leak level). Accordingly, a leak recorded as a 20 would become a leak of 40. Similarly, selecting a distance of 160 would result in the leak being recorded as a 320. This enables the control unit 202 to account for variations in distance between the RF meter 224 and the source of the leak.

It is understood that certain components that are illustrated as being contained in the control unit 202 may be separate components. For example, the GPS unit 218 and the RF meter 224 may both be separate from the control unit 202 and may communicate with the processor 214 via an interface, such as the communications interface 222.

Power to the control unit 202 may be provided from a variety of sources, such as an external direct current source (e.g., a vehicle battery). When the control unit 110 is powered on, a software program is executed by the processor 216, as will be described in greater detail below with reference to FIG. 5.

Figure 3:
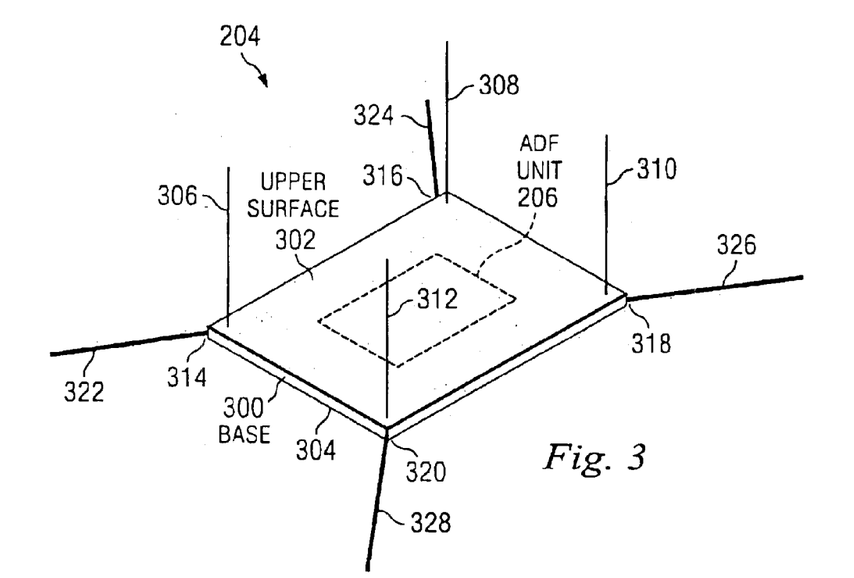
FIG. 3 is a perspective view of an antenna from the system of FIG. 2.

Referring now to FIG. 3, one embodiment of the antenna unit 204 is illustrated in greater detail. In the present example, the antenna unit 204 comprises a relatively rigid square base 300 that is sixteen and a half inches on each side. The base 300 forms a planar surface with an upper surface 302 and a lower surface 304. Four vertical elements 306, 308, 310, 312 are positioned on the upper surface 302 so that one vertical element is at each corner and oriented perpendicular to the planar surface of the base 300. Each vertical element 306, 308, 310, 312 is the same length, which may be generally between eighteen and twenty-four inches long. The actual length selected for the vertical elements depends on the wavelength of the signals to be detected. For example, each vertical element may be approximately ¼ wavelength of the target signal. Cable RF signals used for signal leakage are generally in the range of 108–150 MHz. As is known in the art, the ¼ wavelength for the 150 MHz signal may be calculated as 11811 inches/150/4=19.685 inches. Accordingly, a length may be selected for the vertical elements 306, 308, 310, 312 that maximizes performance over the desired range of frequencies. Furthermore, the vertical elements 306, 308, 310, 312 maybe spaced to avoid undesirable intercoupling, which may occur with a spacing of ⅛ wavelength.

The base 300 includes four corners 314, 316, 318, 320. One of four horizontal elements 322, 324, 326, 328 is attached to each corner and oriented parallel with the planar surface of the base 300. In some embodiments, each corner may be bent upwards or downwards so as to present a small surface that is approximately perpendicular to the planar surface of the base 300. The horizontal elements 322, 324, 326, 328 may then be attached to the small perpendicular surfaces. The horizontal elements 322, 324, 326, 328 serve to extend the size of the base 300 while providing flexibility. For example, if the horizontal elements 322, 324, 326, 328 are each twenty-four inches long, an additional two feet may be added to each side of the base 300, depending on the orientation of the horizontal members. Although more than four horizontal elements may be used, it has been discovered that four horizontal elements are generally sufficient to gather the wavelength and the resulting amplitude.

Because the horizontal members 322, 324, 326, 328 are flexible, they can return to their original position after being displaced. For example, the base 300 may be mounted to the roof of a truck that has a ladder rack on each side. The base 300 may be mounted on one or more "legs" (not shown) that raise the base 300 above the ladder racks. Due to the relatively small footprint of the base 300, not much room is needed. However, the horizontal elements 322, 324, 326, 328 make the base 300 functionally larger and, because they are flexible, they can be displaced by ladders, etc., and return to their original position.

Figure 4:
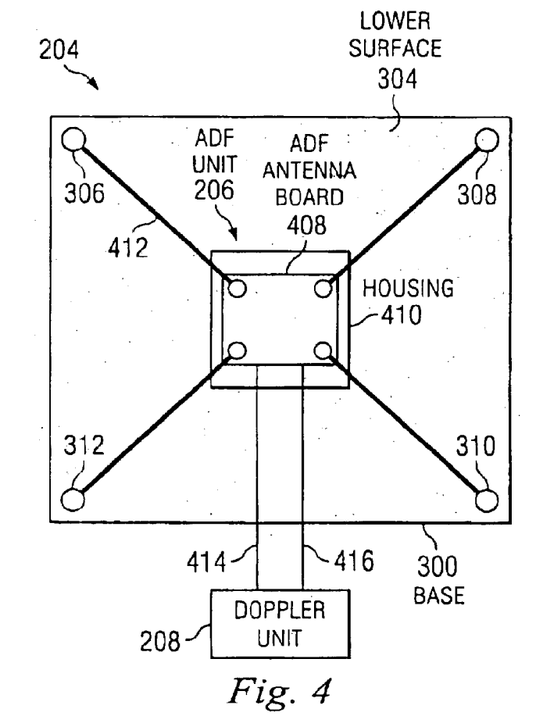
FIG. 4 is an underside view of the antenna of FIG. 3.

Referring also to FIG. 4, the ADF unit 206 may be attached to the lower surface 304 of the antenna unit 104. The ADF unit 106 includes an ADF antenna board 408 that is contained in a housing 410. The ADF antenna board 408 includes four pin diodes that are connected to the four vertical elements 306, 308, 310, 312 (FIG. 3) via connections 412. The ADF antenna board is also connected to the Doppler unit 208 via a coaxial cable 414 and a multiple conductor wire 416. In operation, the pin diodes may be switched on and off relatively quickly by the Doppler unit 208, enabling the coaxial cable 414 to sequence through the vertical elements 306, 308, 310, 312. In the present example, sixteen points of resolution are provided, with each point representing a direction. It is understood that more points of resolution (e.g., thirty-two or sixty-four) may be used to provide additional directional detail.

Figure 5:
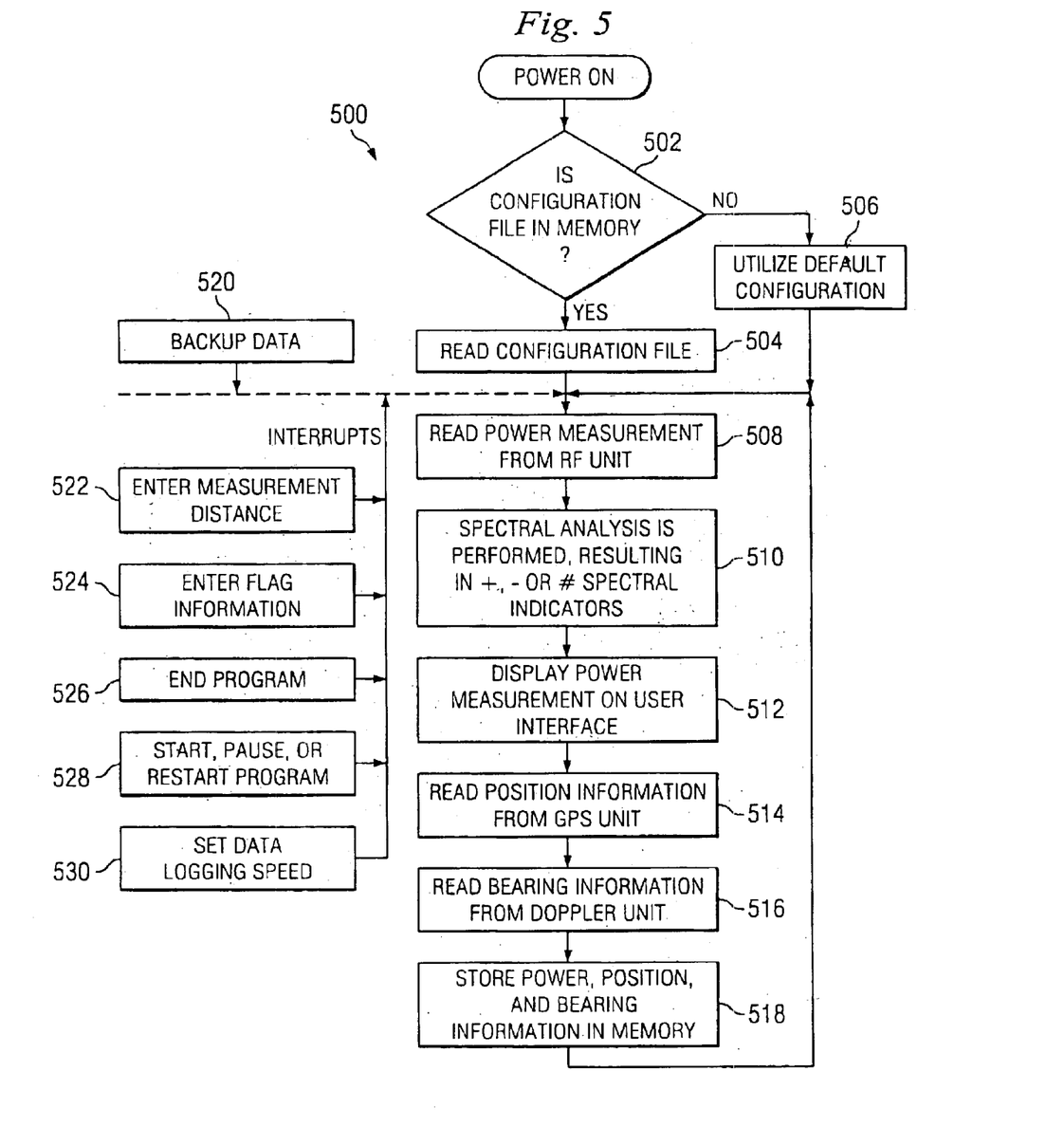
FIG. 5 is a flow chart of an exemplary method for collecting and storing cable leakage data using the leak detection system of FIG. 2.

Referring now to FIG. 5, a method 500 (representing a software program) may be used by the cable leakage detection system 200 of FIG. 2 to detect and store leakage data. In general, the method 500 "reads" signal bearing information from the Doppler unit 208 (as detected by the antenna unit 204 and ADF unit 206), geographic location information (e.g., longitude and latitude) from the GPS unit 218, and signal strength information (e.g., power) from the RF meter 224. The method 500 then extracts the read information and stores it in a file in the memory 216. In the present example, the information is stored in one of four comma delimited text files. The four files pertain to a range of signal strengths. For example, the four files may pertain to signal strength ranges: (1) 0–19 $\mu$V/m; (2) 20–49 $\mu$V/m; (3) 50–149 $\mu$V/m; and (4) 150 $\mu$V/m and up.

After the control unit 202 is powered on, the method 500 controls the reading and storing of information received from the Doppler unit 208, GPS unit 218, user interface 220, and RF meter 224, as well as the display of information through the user interface 220. The storing of information is performed by writing information to the memory 216.

At step 502, the processor 214 of the control unit 202 reads the memory 216 to determine whether a configuration file (not shown) exists on a removable memory device (assuming such a device is present). The configuration file is an editable file that may be used to initialize various parameters of the cable leakage detection system 200. One such parameter may include the default distance between the RF meter 224 and the source of the measured signal. Another such parameter may include a distance at which measurements from the RF meter 224 may be appended with one or more symbols (e.g., a '*', ' ' (a space), '<', or '>') within one of the four comma delimited text files. Each of these symbols is designated as a "DMARK." The DMARK is used to annotate measurements that are being taken by the RF meter 224, when the meter is set at a high sensitivity threshold. For example, measurements made at distances greater than 100 feet, may read 25 $\mu$V/m while the same reading taken at 20 feet may read 5 $\mu$V/m. This DMARK can then be imported along with the measured signal into a mapping program for display. If a configuration file exists on the removable memory device, the method 500 proceeds to step 504.

At step 504, the configuration file is read into the memory (RAM) of the control unit 202. The designated parameters associated with the configuration file are then transferred by the processor 214 to the RF meter 224. Upon receipt of the parameters, the RF meter 224 begins measuring the designated frequency, and calculates the power of the designated frequency according to the distance parameter provided. If, at step 502, a configuration file does not reside in the removable memory device, a default configuration file is read, at step 506, from the memory 216 and transferred to the RF meter 224, as above. The method 500 then proceeds to step 508.

At step 508, the processor 214 of the control unit 202 reads the power measurement from the RF meter 224. Typically, this power measurement is in numerical units such as 50 $\mu$V/m. The power measurement is based on the distance between the RF meter 224 and the source of the measured signal, and relates to the designated frequency band. The method 500 then proceeds to step 510.

At step 510, a spectral analysis is performed to identify spectral indicators based on the power measurements obtained in step 508. The spectral analysis is designed to determine whether a detected RF signal is from a cable leak (CABLE), a power source (POWER), or noise (INTERFERENCE), such as erroneous RF transmissions. In the present example, the following default values (which may be changed by a user) are in use:

| Leak levels ($\mu$V/m) | 1:200 | 2:150 | 3:100 | 4:50 |
|---|---|---|---|---|
| Search radii (m) | 1:200 | 2:150 | 3:100 | 4:50 |

The spectral analysis may model the physics of a leak because leaks with larger values radiate further than leaks with smaller values. For example, it would be difficult to find a 50 $\mu$V/m leak that is close to a 200 $\mu$V/m leak, because the 200 $\mu$V/m leak would mask the 50 $\mu$V/m leak. This relationship is reflected in the spectral analysis. During the spectral analysis, an initial leak parameter is used to identify level 1 leaks (e.g., leaks of 200 $\mu$V/m and higher). A 200 meter leak circle (based on the search radii) is drawn with its origin at the source of the highest leak level. It is understood that a leak circle may not actually be drawn, but that a drawn circle is useful for purposes of illustration. Within the leak circle, the data may be analyzed to identify attributes from which spectral indicators may be derived. For example, spectral indicators may be used to identity whether a detected RF signal is from a cable leak, a power source, or noise. For purposes of illustration, the following spectral indicators are used: '−'=INTERFERENCE; '#'=POWER; '+'=CABLE In the case of power, the data may be analyzed to identify spikes that rise from a noise floor. If a spike is high enough (when compared to a predetermined level), it is assigned the '#' spectral indicator, indicating that the signal is coming from a power source. Similarly, the data may be analyzed to identify video signatures, in which case the source is assigned a '+' spectral indicator. If the data has no identifiable characteristics, it may be assigned a default symbol, such as the '−' spectral indicator. After the spectral analysis is complete, the method 500 continues to step 512.

At step 512, the processor 214 may display the read power measurement via the user interface 220. At this point, a user of the cable leakage detection system 200 can examine a display associated with the user interface 220 to determine the measured signal strength of the designated frequency band. The method 500 then proceeds to step 514, where the processor 214 reads geographical position information from the GPS unit 218. The geographical position information may include such information as longitude, latitude, altitude, and time. The method 500 then proceeds to step 516.

In step 516, the processor 214 receives bearing information from the Doppler unit 208. The Doppler unit 208 may obtain and process bearing information from the antenna unit 204 and ADF unit 206 as follows. In the present example, the Doppler unit 208 rapidly sequences through the pin diodes of the ADF unit 206 and sequentially reads data from each vertical element 306, 308, 310, and 312 of the antenna unit 304. This provides sets of four readings (e.g., data points) that may then be processed by the Doppler unit 208 to provide bearing information based on the strength of the reading from each vertical element 306, 308, 310, and 312. As the antenna unit 204 moves relative to a leak, additional bearing information may be obtained that provides additional information regarding the leak's location through, for example, triangulation.

The method 500 then proceeds to step 518, where the processor 214 stores the power measurement read at step 508, the longitude and latitude geographic information read at step 514, and the bearing information read at step 516, into the memory 216 within the control unit 202. In the present example, the information is stored as a comma delimited text file (e.g., power, longitude, latitude, bearing). The processor 214 then forms a continuous processing loop by proceeding back to step 508. The processing loop, which may include steps 508 through 518, may execute at predetermined intervals, such as once per second. Thus, every second the control unit 202 reads a power measurement from the RF meter 224, geographic information from the GPS unit 218, bearing information from the Doppler unit 208, and stores the power measurement, the longitude and the latitude, and the bearing into a comma delimited text file. This process continues until the control unit 202 is turned off, paused, or until an end command is entered, as discussed below.

The software program embodying the method 500 may include several interrupt routines that are designated as steps 520 through 530. The first, step 520, may be used if the comma delimited text file is stored in temporary memory (e.g., RAM) in step 518 or if a backup copy is to be made. For example, the routine may interrupt the continuous loop of steps 508 through 518 at predetermined intervals (e.g., every two minutes) for the purpose of storing the comma delimited text file into the memory 216 (from RAM) or writing the file to a backup disk, such as a floppy disk. This step provides data backup to the control unit 202 such that if power is lost, no more than two minutes (or another predetermined time interval) of data will be lost.

In some embodiments, the processor 214 may perform processing on the comma delimited text file before storing it. For example, the processing may begin when the processor 214 examines the text file to determine the value of the measured power signal for each second of time. The processor 214 extracts the comma delimited text file into one of the four different text files discussed above according to predefined signal strength criteria. For example, one text file may contain power, longitude and latitude, and bearing for power measurements between 0 and 19 μV/m, a second text file may contain power measurements between 20 and 49 μV/m, a third text file may contain power measurements between 50 and 149 μV/m, and a fourth text file may contain power measurements above 149 μV/m. After extracting the delimited text file into four different text files, the processor 214 may store the files as described. The method 500 then continues the execution loop of steps 508 and 518.

When the processor 214, at step 520, stores the text files, it may first read the memory 216 to determine whether any comma delimited text files already exist. If text files do exist in the memory 216 pertaining to the four signal strength designations, the processor 214 appends the new files onto the preexisting files. Thus, no preexisting files are written over by the processor 214. If no text files exist in the memory 216 during the execution of step 520, the processor 214 creates the files and stores the comma delimited text within them.

A second interrupt, step 522, may occur when a user wishes to change the distance between the RF meter 224 and the measured signal. As described previously, a user may wish to change the distance measurement to provide more accurate power readings depending on the distance to the source of the measured signal. The user enters the desired distance or selects a distance from a predetermined range using the interface 222. Upon receipt, the RF meter 224 calculates the measured power according to the new distance.

A third interrupt, step 524, provides a user with the ability to create other comma delimited text files according to his own criteria. The other text files are termed "flag files" and contain a flag letter (e.g., A, B, or C) as well as longitude, latitude, and bearing. This capability allows a user to log to the memory 216 location information of particular observable information such as a broken cable (flag A), a damaged pedestal (flag B), etc. The files may be created using the user interface 220. The processor 214 stores the flag, along with the most recently read longitude and latitude into a comma delimited text file in the memory 216. The processor 214 may append subsequent flag entries into existing text files in the manner described above.

A fourth interrupt is provided at step 526 which allows a user to end the method 500, and thus end the logging of power measurements to the memory 216. The user can end the method 500, for example, by pressing a key associated with the user interface 220. The key press is transmitted to the processor 214. Upon receipt, the processor 214 stores the existing text files into the memory 216, discontinues reading information from the Doppler unit 208, GPS unit 218, and RF meter 224, and halts program execution. In some embodiments, the control unit 202 may not be able to restart execution until power is turned off and then back on.

A fifth interrupt is provided at step 528 that allows a user to start, pause, or restart the method 500 from the user interface 220. For example, the user may toggle between program execution and program pause by pressing one or more keys associated with the user interface 220. If the method 500 is already being executed, pressing the key may cause the method to pause or suspend execution.

A sixth interrupt may provided at step 530 that allows a user to set the speed at which power, position, and bearing information are read from the RF meter 224, GPS unit 218, and Doppler unit 208, and stored in the memory 216. The speed may be entered via the user interface 220 by entering a desired time interval or by selecting a time interval from a predetermined range. The processor 214 then logs data at a rate corresponding to the entered speed.

In addition to the above interrupts, a supervisory interrupt (not shown) may be provided that produces an error log of particular error conditions that may occur within the control unit 202. For example, an error condition may result from the failure of any one of the RF meter 224, GPS unit 218, Doppler unit 208, or user interface 220 to communicate with the processor 214 within the control unit 202. The error log may be a text file that details the nature of the error and is stored in the memory 216.

Figure 6:
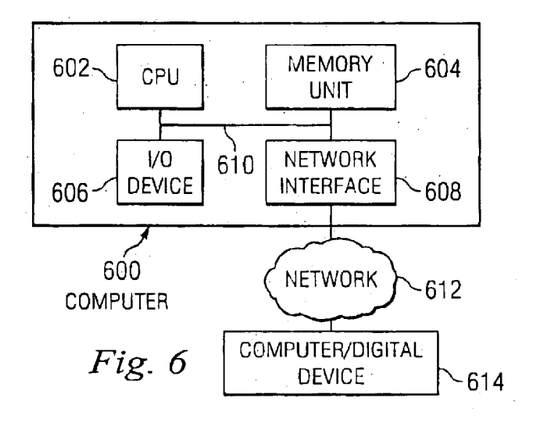
FIG. 6 is an exemplary computer system that may be used to process and provision data collected using the method of FIG. 5.

Referring now to FIG. 6, in another embodiment, an exemplary computer 600, such as may utilize leakage data collected using the method 500 of FIG. 5, is illustrated. The computer 600 may include a central processing unit ("CPU") 602, a memory unit 604, an input/output ("I/O") device 606, and a network interface 608. The components 602, 604, 606, and 608 are interconnected by a bus system 610. It is understood that the computer may be differently configured and that each of the listed components may actually represent several different components. For example, the CPU 602 may actually represent a multiprocessor or a distributed processing system; the memory unit 604 may include different levels of cache memory, main memory, hard disks, and remote storage locations; and the I/O device 606 may include monitors, keyboards, and the like.

The computer 600 may be connected to a network 612. Because the computer 600 may be connected to the network 612, certain components may, at times, be shared with other computers and digital devices 614. Therefore, a wide range of flexibility is anticipated in the configuration of the computer. Furthermore, it is understood that, in some implementations, the computer 600 may act as a server to other computers 614.

Figure 7:
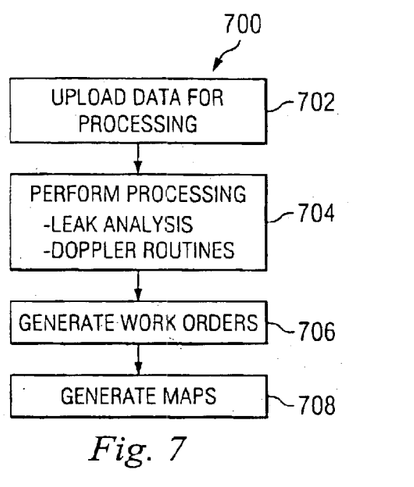
FIG. 7 is a flow chart of a data processing method that may be performed using the computer system of FIG. 6.

Referring now to FIG. 7, in another embodiment, a method 700 illustrates using the computer 600 of FIG. 6 to process data that was collected using the method 500 of FIG. 5. In the present example, the computer 600 is a server and may be accessed by other computers 614. In step 702, data is uploaded to the server 600 for processing. The data may be uploaded to the computer server in a variety of ways. For example, the data may be transferred from the control unit 202 to a computer (e.g., the computer 614) using removable media (e.g., a floppy disk or flash card), by wireless transfer (e.g., Nextel, CDPD, or GSM/GPRS), by a cable (e.g., a serial cable), or by interfacing the control unit 202 with a docking station connected to the computer 614. The computer 614 may then transfer the data to the server 600. In some embodiments, each detection system 200 may be associated with a unique identifier that may be used by the server 600 to identify the source of the uploaded data. Accordingly, a user may initiate an upload procedure by pressing a key associated with the user interface 220 of the control unit 202, at which time a client program residing on the computer 614 will retrieve the data from the memory 216, transfer the data to the server 600, store a backup of the data in the computer 614's memory, and delete the files from the memory 216.

In step 704, the uploaded data is processed. Exemplary processing may include leak analysis (FIGS. 8 and 9) and the execution of Doppler routines on the data (FIG. 10).

Figure 8:
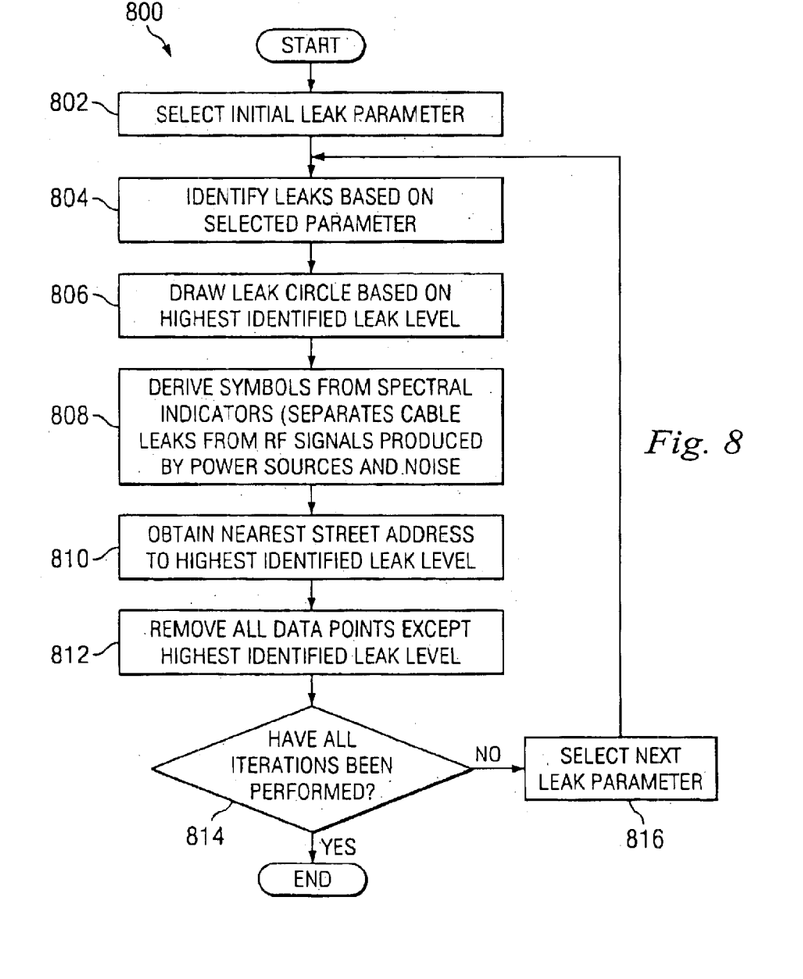
FIG. 8 is a flow chart of a leak analysis that may be performed by the method of FIG. 7.

Referring also to FIG. 8, a method 800 illustrates the leak analysis of step 704 in greater detail. Once the data is uploaded to the server 600, a leak analysis may be initiated that performs a logical search through the data. In the present example, the following default values (which may be changed by a user) are in use:

| Leak levels ($\mu$V/m) | 1:200 | 2:150 | 3:100 | 4:50 |
|---|---|---|---|---|
| Search radii (m) | 1:200 | 2:150 | 3:100 | 4:50 |

The leak analysis may model the physics of a leak because leaks with larger values radiate further than leaks with smaller values. For example, it would be difficult to find a 50 $\mu$V/m leak that is close to a 200 $\mu$V/m leak, because the 200 $\mu$V/m leak would mask the 50 $\mu$V/m leak. This relationship is reflected in the leak analysis.

In steps 802 and 804, the method 800 begins with an initial leak parameter and identifies level 1 leaks (e.g., leaks of 200 $\mu$V/m and higher). In step 806, a 200 meter leak circle (based on the search radii) is drawn with its origin at the source of the highest leak level. It is understood that a leak circle may not actually be drawn, but that a drawn circle is useful for purposes of illustration. The method 800 then proceeds to step 808, where symbols are derived based on spectral indicators (such as those assigned in step 510 of FIG. 5), as is illustrated in greater detail in FIG. 9.

Figure 9:
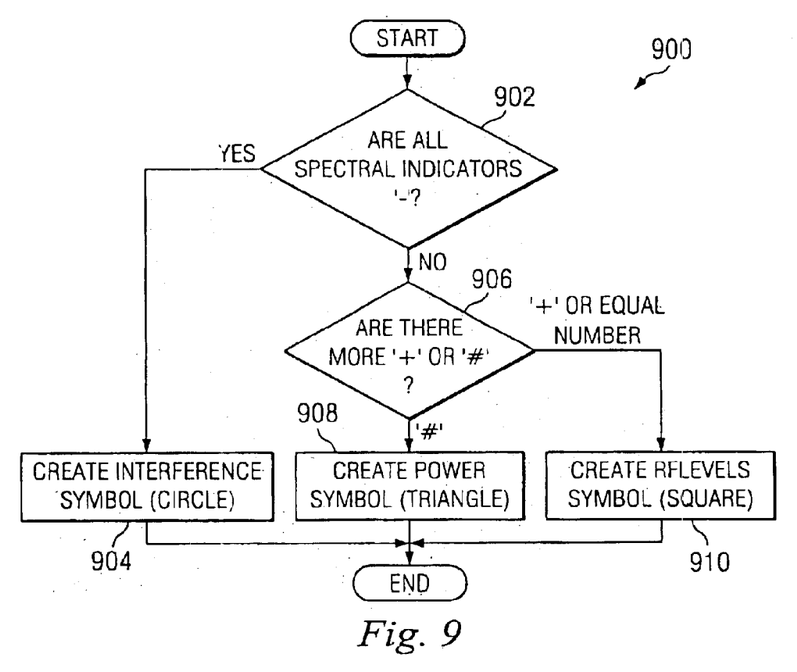
FIG. 9 is a flow chart of one method by which radio frequency sources may be assigned symbols by the method of FIG. 7.
Figure 10:
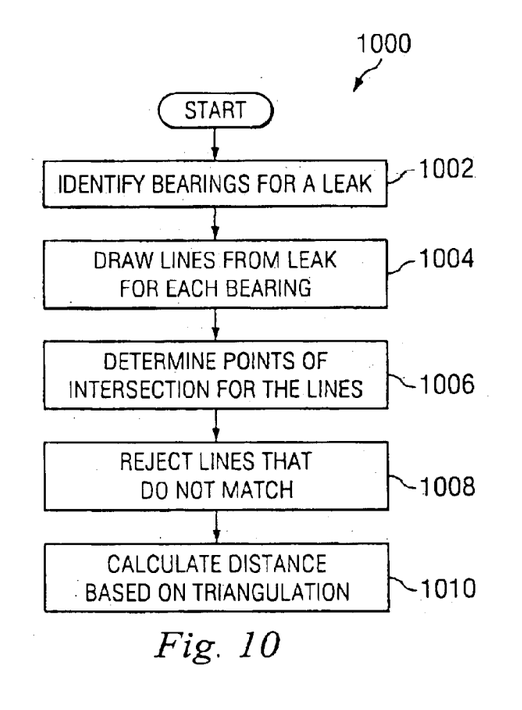
FIG. 10 is a flow chart of a Doppler routine that may be performed by the method of FIG. 7.

Referring also to FIG. 9, a method 900 assigns symbols based on a previous spectral analysis. It is understood that the spectral analysis may be performed as part of the present step if desired. The symbols are designed to indicate whether a detected RF signal is from a cable leak (CABLE), a power source (POWER), or noise (INTERFERENCE), such as erroneous RF transmissions. The leak analysis, using the results of the method 900 and the previously determined amplitudes and spectral indicators, produces a point file (e.g., a data set) that includes an amplitude, a symbol type, and a spectral indicator for each leak. In the present example, the following indicators and symbols are used:

Spectral indicators: '−'=INTERFERENCE; '#'= POWER; '+'=CABLE

Symbols: circle=INTERFERENCE; triangle=POWER; square=CABLE

The symbol (circle, triangle, or square) is selected as follows. In step 902, a determination is made as to whether all the spectral indicators inside the leak circle are '−'. If yes, the method 900 proceeds to step 904, where the INTERFERENCE symbol (circle) is selected. This is the only time the INTERFERENCE symbol is created. If no, the method 900 continues to step 906, where a determination is made as to whether there are more '+' or '#' spectral indicators in the leak circle. The symbol is selected based on a majority, so the POWER symbol (triangle) will be selected if the majority of the spectral indicators are '#' (step 908), and the CABLE symbol (square) will be selected if the majority of the spectral indicators are '+' (step 910). No majority (e.g., a tie) results in the selection of the CABLE symbol (step 910).

Referring again to FIG. 8, after assigning the symbols based on the spectral indicators, the method 800 continues to step 810, where the street address that is nearest to the highest identified leak level is selected. In step 812, all the data points in the leak circle are removed except the highest identified leak level. In step 814, a determination is made as to whether all of the iterations have been performed (e.g., whether leaks have been identified using the predefined parameters). If not, the method 800 proceeds to step 816, where the next leak parameter is selected. The method 800 then returns to step 804 and identifies leaks, performs spectral analysis, etc., as previously described with respect to steps 804–814. This enables the method 800 to identify and label smaller leaks that were covered by the highest identified leak level. After the leak analysis is completed, the method 800 ends and the method 700 of FIG. 7 may execute a Doppler routine, as is described in greater in detail with reference to FIG. 10.

Referring now to FIG. 10, a method 1000 uses bearing information collected via the Doppler unit 208 to more accurately characterize a leak. Although the method 1000 is illustrated for purposes of clarity as a method separate from the leak analysis method 700 of FIG. 7, it is understood that the method 1000 may be integrated into the method 700.

Doppler based data may be used to overcome problems associated with determining a source of the leak. For example, when a vehicle is on a ride-out, it is difficult to calculate the actual distance from the vehicle to the cable. One way to do this is to use an estimated range, as was described above with respect to FIG. 5. Another way is to incorporate Doppler data, as this allows such benefits as a triangulation. However, one problem with Doppler based data stems from reflected signals (e.g., multi path). These reflected signals may be detected, even though they are erroneous. Multi path may affect both the amplitude of RF leakage levels and the calculated location of the leaks. As will be described below, the negative effect of multi path may be overcome while processing the bearing data.

In step 1002, all bearings for each measured leak are identified. In step 1004, lines are "drawn" (e.g., calculated) out from each measured leak using the bearing information. For example, if bearing information is taken on a single leak once a second for three seconds, there would be three lines drawn from the leak. In steps 1006 and 1008, points of intersection are determined for the lines associated with each leak and, if a line does not match, it is rejected as being the result of multi path. In some embodiments, a range of intersecting lines may be averaged during the processing. For example, one line that is twenty feet from a point may be averaged with another line that is forty feet from the point to produce a single line that is thirty feet from the point.

In step 1010, the distance to the leak can be calculated using triangulation. The calculated distance may then be used to alter the multiplier for that leak to more accurately identify the amplitude of the leak. For example, a leak detected at 4 $\mu$V/m with a calculated distance of 80 feet would be identified as a 32 $\mu$V/m leak.

The bearing information may also be examined to identify patterns that provide additional details regarding a leak. For example, a leak may be in a cable located at the back of a house, rather than on a pole. During a ride-out, RF signals from the leak may be detected when the detection system 200 is positioned on the road between the house where the leak occurs and a neighboring house, but may be blocked when a house is between the detection system 200 and the leak. Accordingly, data representing the leak will exist for the time the leak is detected (from between the houses), but there will be no data for the positions on either side of the leak (where a house is blocking the leak from being detected). Therefore, by examining the data for a general pattern (such as NULL, leak data, NULL), it may be determined that the leak is at the back of a house, rather than on a pole. Other patterns may be used to identify similar information.

It is understood that the bearing information may be used in addition to the distance information gathered with respect to FIG. 5 (e.g., as a check) or may replace the distance data entirely. After the leaks are processed using the Doppler routine, the method 1000 ends and the method 700 of FIG. 7 continues to step 706.

Figure 11:
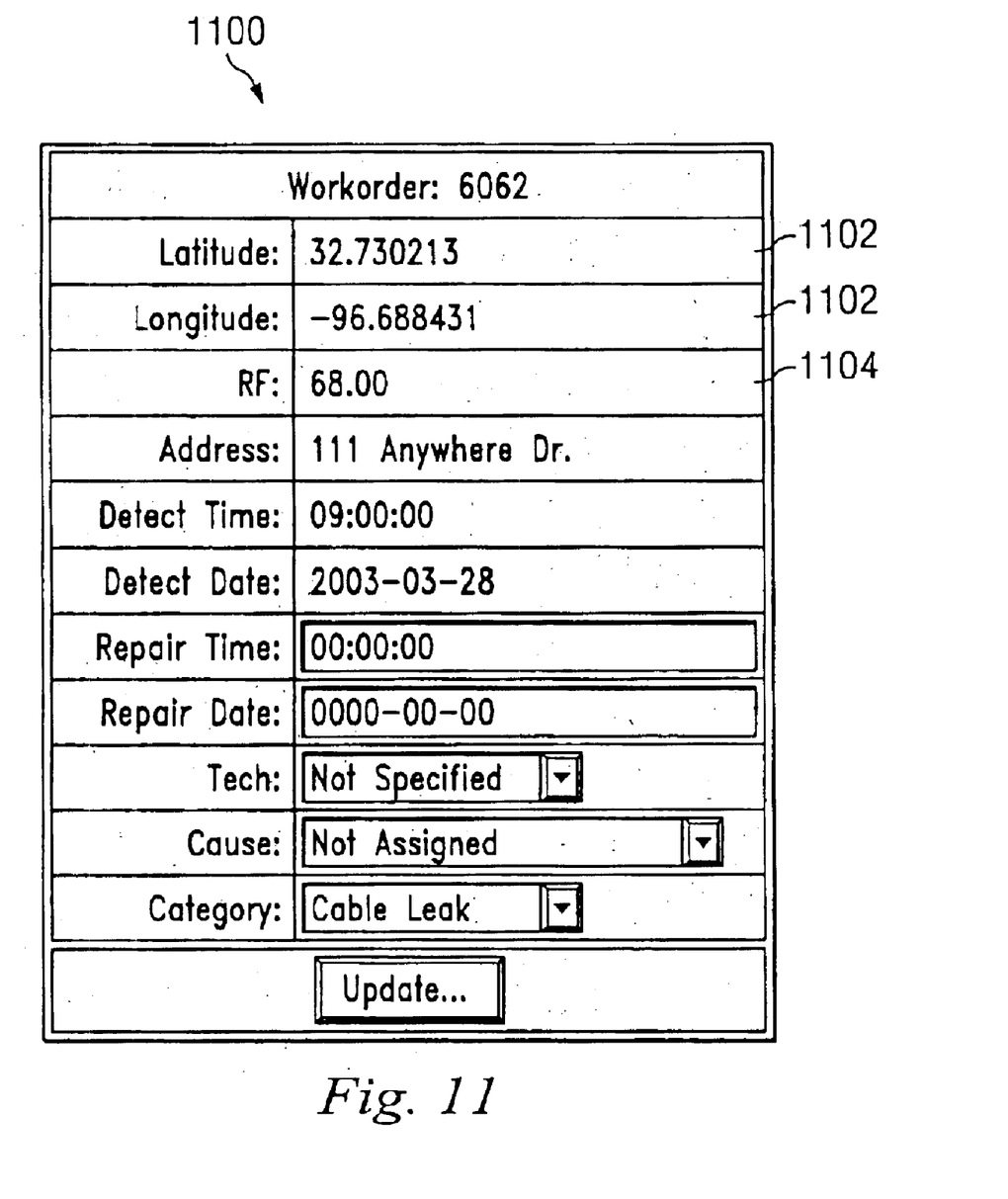
FIG. 11 is an exemplary screen shot of a work order that may be generated by the method of FIG. 7.

Referring again to FIG. 7 and also to FIG. 11, work orders may be generated in step 706 based on the processing of step 704. Referring specifically to FIG. 11, a work order 1100 may include location information 1102, amplitude of the leak 1104 (which may be corrected using Doppler data as described with respect to FIG. 10), and additional information. In some embodiments, the work order may be emailed to a technician and/or may be viewed as a web page provided by the server 600.

Figure 12:
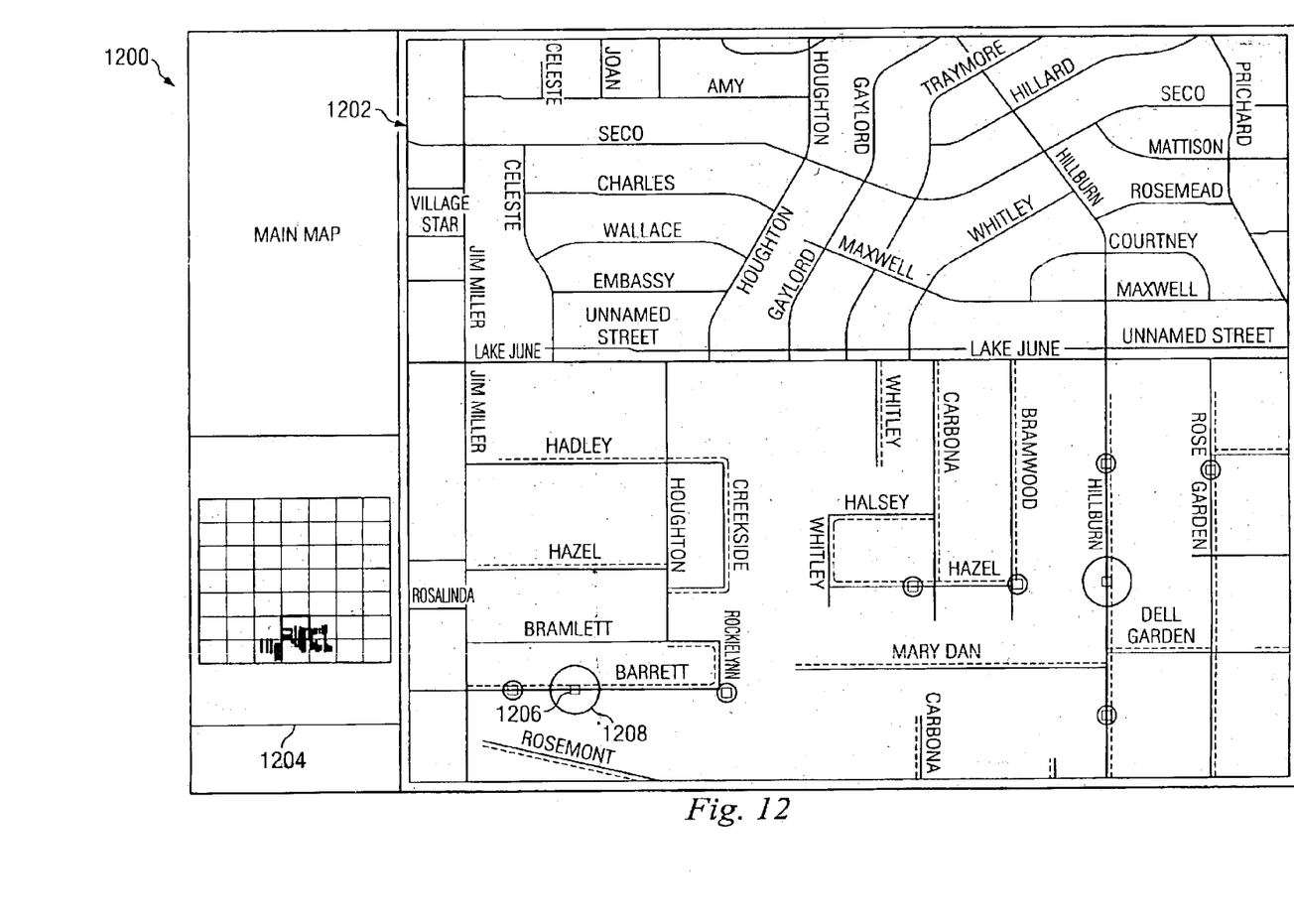
FIG. 12 is an exemplary screen shot of a map that may be generated by the method of FIG. 7.

Referring again to FIG. 7 and also to FIG. 12, maps and associated information may be generated in step 708. Referring specifically to FIG. 12, a map screen 1200 illustrates a map 1202 of a leakage area may be generated by superimposing the processed data onto a digital map by latitude and longitude. For example, the latitude and longitude of the work order of FIG. 11 may be used to place the leak onto the map of FIG. 12, along with an associated symbol 1206 as described above (e.g., a square for a cable leak). A circle 1208 may be drawn around each leak to indicate the amplitude of the leak or other information. Flag information (e.g., to indicate a broken wire or a damaged pedestal) may also be indicated on the map or in a comments section. Another map 1204 may reproduce the general area of which the map 1202 is a part. It is understood that the view of the map may be adjustable (e.g., zoomed in or out), and that other known map techniques may be used to alter the map as desired.

Other functionality may be incorporated into the method 700 as desired. For example, a user may access a map or list of ride-outs, along with leaks that were detected during each ride-out. A user may also define leak parameters that are used for processing the data, as well as flags and other information. In addition, the method 700 may be used to generate summaries, reports, or other compilations of data to enable users to more accurately estimate repair costs, equipment upgrades, personnel needs, and perform other planning tasks. Furthermore, the method 700 may incorporate the data into a report, such as is required by the FCC, and automatically file the report.

While the preceding description shows and describes one or more embodiments, it will be understood by those skilled in the art that various changes in form and detail may be made therein without departing from the spirit and scope of the present disclosure. For example, although a server is used to describe various embodiments of the present disclosure, another computer or other digital device could also be used. In addition, LORAN or other positioning techniques may be used. Also, other mapping approaches may be utilized as disclosed in detail in U.S. Pat. No. 5,294,937, entitled "CABLE LEAKAGE MONITORING SYSTEM" and assigned to the same assignee as the present disclosure, and hereby incorporated by reference as if reproduced in its entirety. Therefore, the claims should be interpreted in a broad manner, consistent with the present disclosure.

What is claimed is:

1. A method for identifying a radio frequency (RF) leak location in a cable television system, wherein the method uses leak data that includes a plurality of data sets, wherein each data set includes a longitude, a latitude, and Doppler-based bearing information, the method comprising:
    analyzing the bearing information associated with a leak;
    discarding erroneous bearing information that results from multi path; and
    calculating a location of the leak using a triangulation process based on the longitude, latitude, and bearing information of at least two of the plurality of data sets.

2. The method of claim 1 further comprising searching for at least one pattern in the plurality of data sets, wherein the pattern enables the location of the leak to be identified with greater accuracy than using the triangulation process alone.

3. The method of claim 1 further comprising multiplying an amplitude of the leak by a distance-based multiplier, wherein the multiplier is adjusted according to a distance calculated using the triangulation process.

4. The method of claim 1 further comprising characterizing the leak to determine whether it is a cable television leak, wherein the characterizing includes performing a spectral analysis.

5. The method of claim 1 wherein analyzing the bearing information further comprises:
    identifying each bearing associated with the leak;
    calculating a line through each identified bearing and the leak; and calculating one or more points of intersection between the lines.

6. The method of claim 5 further comprising using a range to calculate the points of intersection, so that lines falling within the range are identified as intersecting and lines falling outside the range are identified as not intersecting.

7. The method of claim 5 further comprising averaging two or more lines to form an average line and using the averaged line when calculating the one or more points of intersection.

8. The method of claim 1 further comprising generating a map based on the calculated location of the leak.

9. The method of claim 8 wherein generating the map further comprises:
creating a symbol for the leak based on a spectral analysis, wherein the symbol indicates whether the leak is an emission from a cable television system;
creating an amplitude indicator for the leak based on an amplitude of the leak; and
assigning an address to the leak based on the calculated location of the leak.

10. A system for detecting a radio frequency (RF) leak in a cable television plant, the system comprising:
a processor;
an antenna unit accessible to the processor, wherein the antenna unit comprises:
a base;
at least four vertical elements, wherein each vertical element is oriented approximately perpendicular to the base and connected thereto; and
at least four horizontal elements, wherein each horizontal element is oriented approximately parallel to the base and connected thereto for extending a ground plane formed by the base;
a positioning unit accessible to the processor for providing a current location; and
an RF detector accessible to the processor for detecting an amplitude of an RF emission, wherein bearing data is generated based on a signal received from each of the four vertical elements from the antenna unit, and wherein the processor stores the bearing data, current location, and amplitude in a memory.

11. The system of claim 10 further comprising a communication unit for transferring the stored bearing data, current location, and amplitude from the memory to an external device for processing.

12. The system of claim 11 wherein the communication unit is operable to effect the transfer in a wireless manner.

13. The system of claim 10 wherein the base is substantially rigid and wherein each of the vertical and horizontal elements is flexible.

14. A network accessible computer system for processing data associated with a plurality of radio frequency (RF) leaks in a cable television system, wherein the data includes a plurality of data sets, each data set containing signal information, an amplitude, a longitude, a latitude, and Doppler-based bearing information, the system comprising:
a processor;
a memory accessible to the processor, wherein the memory is operable to store the plurality of data sets; and
a plurality of instructions for processing by the processor, the instructions for:
performing a spectral analysis of the signal information to identify whether an RF emission is a leak is from the cable television system;
performing a Doppler analysis using the longitude, latitude, and bearing information to calculate a location of each leak; and
automatically generating leak information using the location calculated by the Doppler analysis.

15. The system of claim 14 wherein the Doppler analysis further comprises instructions for:
analyzing bearing information associated with each leak;
rejecting bearing information that results from erroneous data, wherein the erroneous data is identified during the analyzing; and
calculating a location of the leak using a triangulation process based on the longitude, latitude, and bearing information of at least two of the data sets.

16. The system of claim 15 wherein the Doppler analysis further comprises:
identifying bearings associated with each leak in the bearing information;
calculating a line through each identified bearing and the associated leak; and
calculating one or more points of intersection between the lines of each leak.

17. The system of claim 16 further comprising using a range to calculate the points of intersection, so that lines falling within the range are identified as intersecting and lines falling outside the range are identified as not intersecting.

18. The system of claim 17 further comprising using an average to calculate a line, wherein two or more lines are averaged to form an average line.

19. The system of claim 14 wherein the leak information is made available to a user via a web browser.

20. The system of claim 14 further comprising a wireless communications interface, wherein data can be transferred from a data collection device to the computer system via the wireless communications interface in a wireless manner.

* * * * *